(12) United States Patent
Jonishi

(10) Patent No.: US 12,707,710 B2
(45) Date of Patent: Aug. 11, 2026

(54) SEMICONDUCTOR DEVICE

(71) Applicant: FUJI ELECTRIC CO., LTD., Kawasaki (JP)

(72) Inventor: Akihiro Jonishi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 369 days.

(21) Appl. No.: 18/456,943

(22) Filed: Aug. 28, 2023

(65) Prior Publication Data

US 2024/0128266 A1 Apr. 18, 2024

(30) Foreign Application Priority Data

Oct. 18, 2022 (JP) ................................ 2022-166658

(51) Int. Cl.
*H10D 84/84* (2025.01)

(52) U.S. Cl.
CPC .................................. *H10D 84/84* (2025.01)

(58) Field of Classification Search
CPC ........ H10D 84/84; H10D 30/65; H10D 84/83; H10D 84/0191; H10D 84/854; H10D 84/856; H10D 84/0156; H10D 84/038; H10D 89/60; H01L 21/761
See application file for complete search history.

(56) References Cited

U.S. PATENT DOCUMENTS 5,218,224 A * 6/1993 Taguchi ........... H10W 10/0127 257/547
6,507,085 B2 1/2003 Shimizu
7,595,536 B2 9/2009 Terashima
7,812,402 B2 10/2010 Hatade
10,135,445 B2 11/2018 Yamaji
10,658,504 B2 5/2020 Yamaji
11,562,995 B2 1/2023 Yamaji
2002/0113286 A1 8/2002 Shimizu
2006/0118860 A1 6/2006 Hatade
(Continued)

FOREIGN PATENT DOCUMENTS

JP 2002-324848 A 11/2002
JP 2007-88198 A 4/2007
(Continued)

OTHER PUBLICATIONS

Japanese Office Action issued May 19, 2026 for Japanese Application No. 2022-166658.

*Primary Examiner* — Mohammad A Rahman

(57) ABSTRACT

A semiconductor device includes: a semiconductor base body of a first conductivity-type; a first well region of a second conductivity-type provided in the semiconductor base body; at least one second well region of the first conductivity-type implementing a part of a high-side circuit provided in the first well region; a buried layer of the second conductivity-type provided at a bottom of the first well region and having a higher impurity concentration than the first well region; a voltage blocking region of the second conductivity-type provided at a circumference of the first well region; and an extraction region of the first conductivity-type provided to have a greater depth than the second well region at least at a part of a circumference of the high-side circuit in the first well region so as to be opposed to the second well region.

17 Claims, 10 Drawing Sheets

(56) References Cited

U.S. PATENT DOCUMENTS

| | | | |
|---|---|---|---|
| 2007/0063293 | A1 | 3/2007 | Terashima |
| 2016/0308534 | A1 | 10/2016 | Yamaji |
| 2019/0157450 | A1 | 5/2019 | Yamaji |
| 2020/0328203 | A1 | 10/2020 | Yamaji |

FOREIGN PATENT DOCUMENTS

| | | | |
|---|---|---|---|
| JP | 4620437 | B2 | 1/2011 |
| JP | 2019-96651 | A | 6/2019 |
| JP | 2020-174173 | A | 10/2020 |
| WO | 2016/002508 | A1 | 1/2016 |

* cited by examiner

100
VB
HO
VS
IGBT
TO GATE
IGBT
TO SOURCE
106
112
111
HIGH-SIDE CIRCUIT
101
113
115
114
RESET
SET
R2
104b
R1
104a
124
SET
RESET
125
121
VCC
102
LOW-SIDE CIRCUIT
HIN
122
GND
123

100
A
A'
10
10a
10b
104a
104b
105
101
106

100
A
A'
105
101
104a
104b
106

100
A
A'
105
101
106
104a
104b
54a 55a 57a 58a 56a
26 53 25 24 22 23 51 50 52 21 53 24 25 26
56b 58b 57b 55b 54b 42 41
p n n p n+ n- p n n p n p n n+ p n n p p
30 29a 28a 16a 15a 14 27a 18a 19a 14 10 11 31 11 111 13 12 110 20 112 31 11 14 19b 18 27b 14 15b 16b 28b 29b 30

100
A
A'
104a
104b
105
101
106
54a
55a
57a
58a
56a
82
81
26
53
25
24
23
22
51
50
52
21
54b
55b
57b
58b
56b
41
42
30
29a
28a
16a
15a
75
10
14
27a
18a
19a
11
77
32
31
73
71
12
13
70
20
72
74
78
76
15b
16b
28b
29b
27b
18
19b

100
A
A'
104a
104b
105
101
106

SEMICONDUCTOR DEVICE

CROSS-REFERENCE TO RELATED APPLICATION

This application claims benefit of priority under 35 USC 119 based on Japanese Patent Application No. 2022-166658 filed on Oct. 18, 2022, the entire contents of which are incorporated by reference herein.

BACKGROUND OF THE INVENTION

1. Field of the Invention

The present invention relates to a semiconductor device such as a high-voltage integrated circuit (HVIC).

2. Description of the Related Art

Conventional technique for driving gates is known that typically uses transformers or photocouplers for electrical isolation in semiconductor power switching elements such as an insulated gate bipolar transistor (IGBT) implementing a bridge circuit for power conversion. Recently, the use of a high-voltage integrated circuit (referred to below as a "HVIC") mainly with a small capacity has become more popular that does not exhibit electrical isolation so as to reduce costs.

JP 4620437 B2 discloses a conventional HVIC. The HVIC includes a gate drive circuit that drives a gate of a semiconductor power switching element, a control circuit that controls the gate drive circuit, and a level shifter that transmits signals between the gate drive circuit and the control circuit. The gate drive circuit is provided in a high-potential region separated from the control circuit side by a high-voltage isolation structure.

The high-potential region is provided with a parasitic pnp transistor that uses an n-type well region formed in a p-type substrate as a base and a p-type well region formed in the n-type well region as an emitter. During a normal operation of the HVIC, a VB potential applied to the n-type well region is kept at a higher level by 15 volts than a VS potential applied to the p-type well region. The parasitic pnp transistor is thus in a reverse bias state between the base and the emitter, and no current flows through the parasitic pnp transistor. The parasitic pnp transistor is, however, led to be a forward bias state between the base and the emitter when the V B potential falls below the VS potential by 0.6 volts or greater because of external noise derived from lightning, for example. The parasitic pnp transistor is then turned on, and a collector current in the parasitic pnp transistor is led to flow through the p-type substrate, which could cause damage to the HVIC.

To avoid the damage to the HVIC derived from such external noise, the conventional HVIC includes an $n^+$-type buried layer having a high impurity concentration deposited at a bottom of the n-type well region. This configuration decreases a current amplification factor hFE in the parasitic pnp transistor immediately under the p-type well region. The current amplification factor hFE is, however, not decreased in the parasitic pnp transistor formed in a diagonal direction from the p-type well region toward a region around an end part of the $n^+$-type buried layer, since the $n^+$-type buried layer is not provided in the base layer. Such a configuration thus inevitably causes the collector current to flow through the p-type substrate.

To deal with the problem described above, JP 2002-324848 A discloses a configuration in which an n-type diffusion layer having a high impurity concentration and deposited to have a depth reaching an $n^+$-type buried layer is arranged at an end part of the $n^+$-type buried layer so as to decrease a current amplification factor hFE of a parasitic pnp transistor formed in a diagonal direction from a p-type well region toward a region around the end part of the $n^+$-type buried layer.

The provision of the deep n-type diffusion layer with the high impurity concentration as disclosed in JP 2002-324848 A, however, inevitably needs to add an extra step of forming such a deep n-type diffusion layer with the high impurity concentration, increasing process costs accordingly.

SUMMARY OF THE INVENTION

In view of the foregoing problems, the present invention provides a semiconductor device having a configuration capable of suppressing an operation of a parasitic element derived from external noise so as to prevent damage to the semiconductor device.

An aspect of the present invention inheres in a semiconductor device including: a semiconductor base body of a first conductivity-type; a first well region of a second conductivity-type provided in the semiconductor base body; at least one second well region of the first conductivity-type implementing a part of a high-side circuit provided in the first well region; a buried layer of the second conductivity-type provided at a bottom of the first well region and having a higher impurity concentration than the first well region; a voltage blocking region of the second conductivity-type provided at a circumference of the first well region; and an extraction region of the first conductivity-type provided to have a greater depth than the second well region at least at a part of a circumference of the high-side circuit in the first well region so as to be opposed to the second well region.

DETAILED DESCRIPTION

Figure 1:
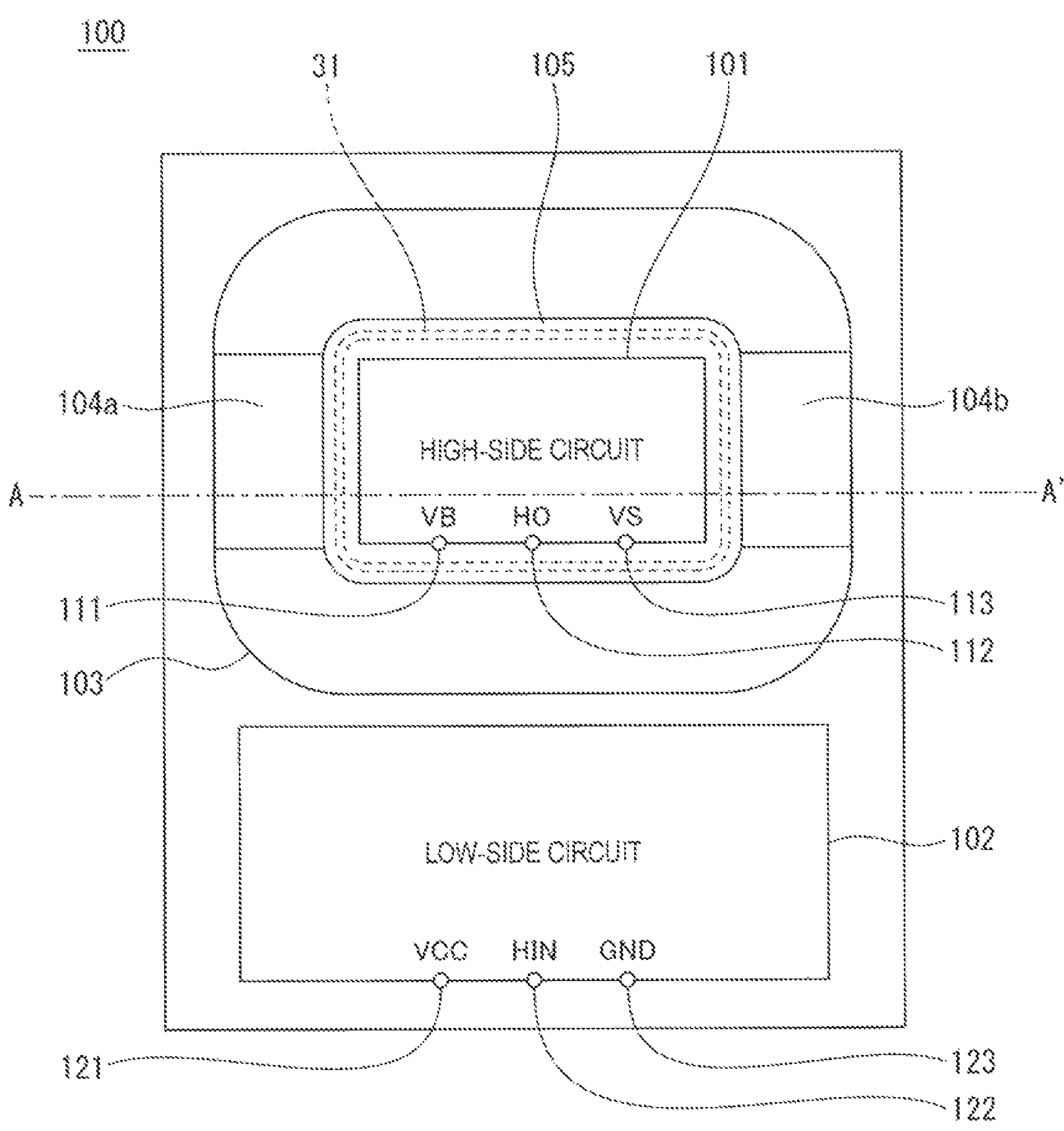
FIG. 1 is a plan view illustrating a semiconductor device according to a first embodiment.

With reference to the drawings, first to fourth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

The first to fourth embodiments described below merely illustrate schematically devices and methods for specifying and giving shapes to the technical idea of the present invention, and the span of the technical idea is not limited to materials, shapes, structures, and relative positions of elements described herein.

In the specification, a "carrier supply region" means a semiconductor region which supplies majority carriers as a main current. The carrier supply region is assigned to a semiconductor region which will be a source region in a field-effect transistor (FET) or a static induction transistor (SIT), an emitter region in an insulated-gate bipolar transistor (IGBT), and an anode region in a static induction (SI) thyristor or a gate turn-off (GTO) thyristor. A "carrier reception region" means a semiconductor region which receive the majority carriers as the main current. The carrier reception region is assigned to a semiconductor region which will be the drain region in the FET or the SIT, the collector region in the IGBT, and the cathode region in the SI thyristor or GTO thyristor. A "control electrode" means a gate electrode in the FET, the SIT, the IGBT, the SI thyristor or the GTO thyristor, and has a function of controlling the flow of the main current between the carrier supply region and the carrier reception region.

In the specification, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

In the specification, there is exemplified a case where a first conductivity-type is an p-type and a second conductivity-type is a n-type. However, the relationship of the conductivity-types may be inverted to set the first conductivity-type to the n-type and the second conductivity-type to the p-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, the members and the regions that are limited by adding "first conductivity-type" and "second conductivity-type" in the following description indicate the members and the regions formed of semiconductor materials without particular obvious limitations.

First Embodiment

An HVIC 100 that is a semiconductor device according to a first embodiment includes a high-side circuit 101, a low-side circuit 102, and level shifters 104*a* and 104*b* integrally provided in the same semiconductor chip, as illustrated in FIG. 1. The high-side circuit 101 is formed in a high-potential region 105. The high-potential region 105 is isolated from the low-side circuit 102 by a high-voltage isolation structure 103 that is a high-voltage junction terminal (HVJT) provided to surround the high-potential region 105. The level shifters 104*a* and 104*b* are arranged to be integrated with a part of the high-voltage isolation structure 103.

The high-side circuit 101 incudes a circuit that drives a gate of a semiconductor power switching element such as an IGBT implementing a bridge circuit for power conversion. The high-side circuit 101 includes an n-channel MOSFET and a p-channel MOSFET. The high-side circuit 101 includes a VB terminal 111, an HO terminal 112, and a VS terminal 113. The high-side circuit 101 operates with a VS potential, as a reference potential, that is a floating potential connected to the VS terminal 113 and with a VB potential as a power-source potential connected to the VB terminal 111 and higher than the VS potential.

The VB potential is a maximum potential applied to the HVIC 1X), and is kept higher than the VS potential by about 15 volts in a normal state not influenced by noise. The VS potential varies between about zero volts and several hundreds of volts depending on the switching operation of the semiconductor power switching element.

The low-side circuit 102 corresponds to a low-side circuit region. The low-side circuit 102 controls the high-side circuit 101. The low-side circuit 102 includes a VCC terminal 121, an HIN terminal 122, and a GND terminal 123. The low-side circuit 102 operates with a GND potential (a ground potential) as a reference potential connected to the GND terminal 123 and with a VCC potential as a power-source potential connected to the VCC terminal 121 and higher than the GND potential.

The level shifters 104*a* and 104*b* are implemented by a high-voltage n-channel MOSFET, for example. The level shifters 104*a* and 104*b* convert a signal based on the GND potential from the low-side circuit 102 to a signal based on the VS potential when the gate is turned ON and OFF so as to transmit the converted signal to the high-side circuit 101. The level shifter 104*a* on one side is used for setting, and the level shifter 104*b* on the other side is used for resetting.

Figure 2:
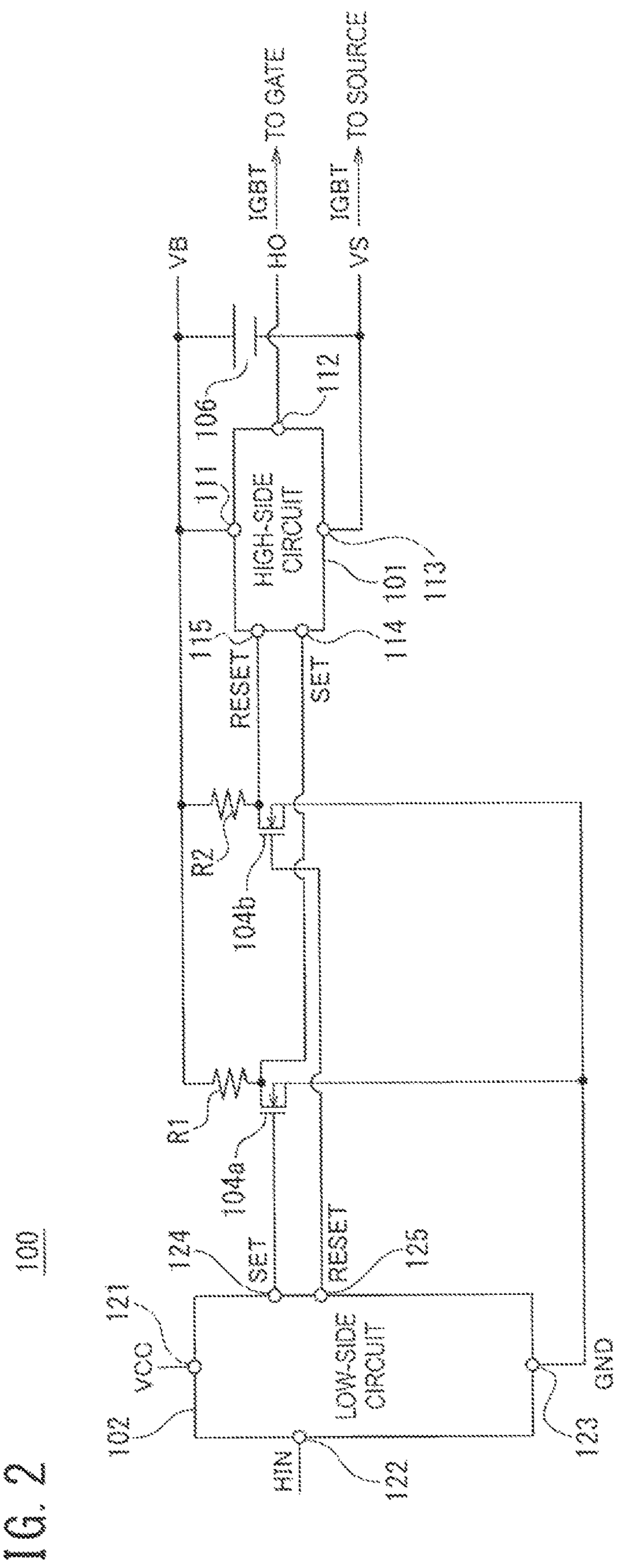
FIG. 2 is a circuit diagram illustrating the semiconductor device according to the first embodiment.

FIG. 2 is an equivalent circuit diagram of the semiconductor device according to the first embodiment illustrated in FIG. 1. Agate of the level shifter 104*a* for setting is connected with an output terminal 124 of the low-side circuit 102. A drain of the level shifter 104*a* is connected with a level-shift resistor R1 and an input terminal 114 of the high-side circuit 101. A source of the level shifter 104*a* is connected with the GND terminal 123 of the low-side circuit 102.

A gate of the level shifter 104*b* for resetting is connected with an output terminal 125 of the low-side circuit 102. A drain of the level shifter 104*b* is connected with a level-shift resistor R2 and an input terminal 115 of the high-side circuit 101. A source of the level shifter 104*b* is connected with the GND terminal 123 of the low-side circuit 102. The VCC potential that is the power-source potential of the low-side circuit 102 is applied to the VCC terminal 121 of the low-side circuit 102.

The respective level-shift resistors R1 and R2 are connected to the high-potential (the VB potential) side of a power source 106. The VB terminal 111 of the high-side circuit 101 is connected to the high-potential (the VB potential) side of the power source 106. The VS terminal 113 of the high-side circuit 101 is connected to the low-potential (the VS potential) side of the power source 106 and a source of the IGBT that is the semiconductor power switching element. The HO terminal 112 of the high-side circuit 101 is connected with a gate of the IGBT that is the semiconductor power switching element.

An example of the switching operation of the semiconductor device according to the first embodiment is described below with reference to FIG. 2. The low-side circuit 102 turns on the level shifter 104*a* for a predetermined period of time, and transmits a turn-on signal SET based on the GND potential to the level shifter 104*a* when an input signal HIN input to the HIN terminal 122 of the low-side circuit 102 is shifted from a low (L) level to a high (H) level. The level shifter 104*a* converts the turn-on signal SET based on the GND potential sent from the low-side circuit 102 to a turn-on signal SET based on the VS potential so as to transmit the converted signal to the high-side circuit 101. The high-side circuit 101 changes an output HO of the high-side circuit 101 from the L-level to the H-level in accordance with the turn-on signal SET based on the VS potential from the level shifter 104*a*, and drives the gate of the IGBT that is the semiconductor power switching element.

The low-side circuit 102 turns on the level shifter 104*b* for a predetermined period of time, and transmits a turn-off signal RESET based on the GND potential to the level shifter 104*b* when the input signal HIN input to the HIN terminal 122 of the low-side circuit 102 is changed from the H-level to the L-level. The level shifter 104*b* converts the turn-off signal RESET based on the GND potential sent from the low-side circuit 102 to a turn-off signal RESET based on the VS potential so as to transmit the converted signal to the high-side circuit 101. The high-side circuit 101 changes the output HO of the high-side circuit 101 from the H-level to the L-level in accordance with the turn-off signal RESET based on the VS potential from the level shifter 104*b*.

Figure 3:
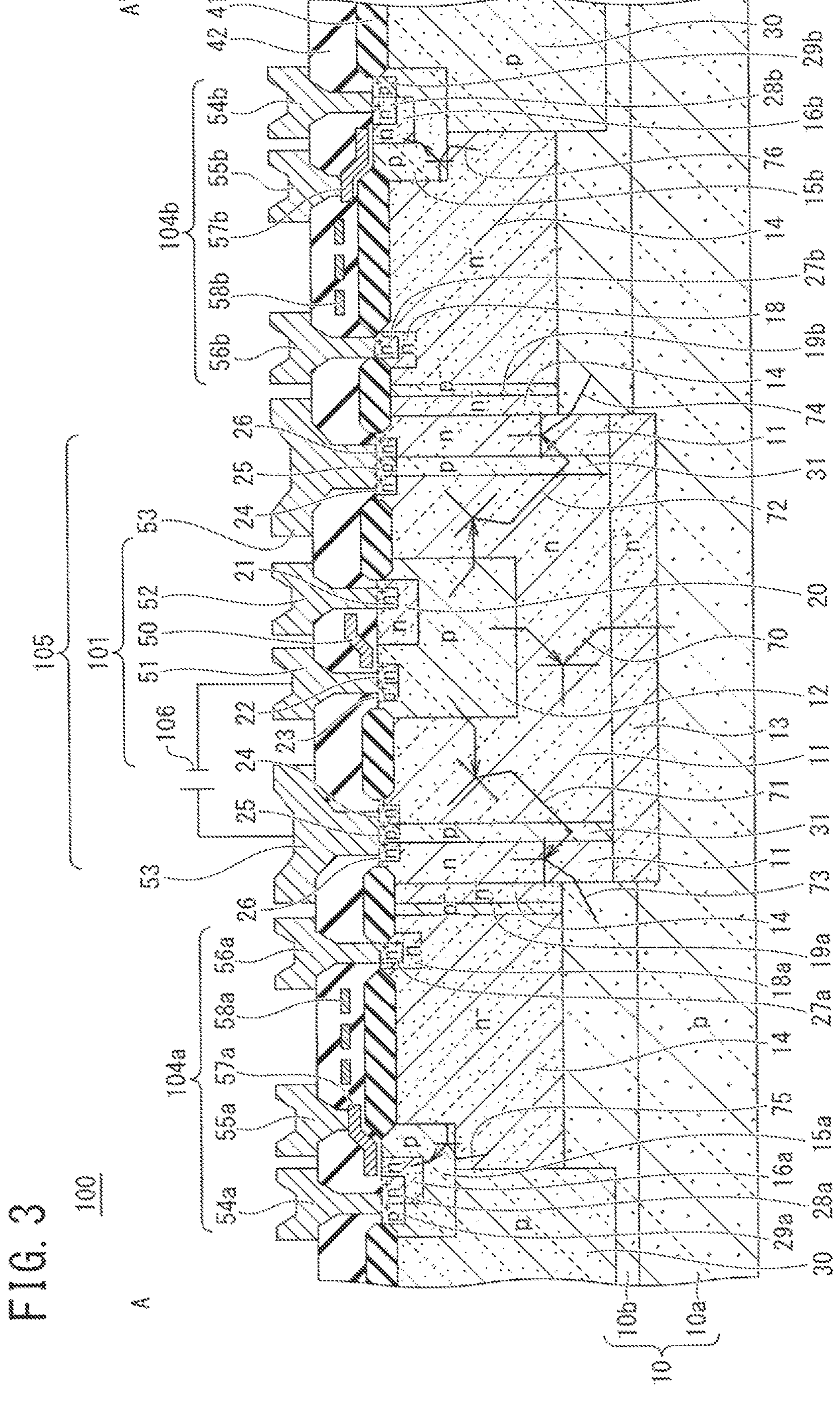
FIG. 3 is a cross-sectional view illustrating the semiconductor device according to the first embodiment.

FIG. 3 is a cross-sectional view taken along line A-A passing through the high-potential region 105 and the respective level shifters 104*a* and 104*b*. The semiconductor device according to the first embodiment includes a p-type semiconductor base body 10 in which the high-potential region 105 and the respective level shifters 104*a* and 104*b* are provided. A first insulating film 41 and a second insulating film 42 are deposited on the top surface of the semiconductor base body 10.

The semiconductor base body 10 is a silicon (Si) substrate, for example, or may be a semiconductor (wide band-gap semiconductor) substrate having a wider band gap than Si, such as silicon carbide (SiC), gallium nitride (GaN), gallium oxide ($Ga_2O_3$), diamond (C), or aluminum nitride (AlN). The semiconductor base body 10 may include a p-type semiconductor substrate and a p-type epitaxially-grown layer epitaxially grown on the semiconductor substrate. FIG. 3 illustrates a case in which the semiconductor base body 10 includes a p-type semiconductor substrate 10*a* and a p-type epitaxially-grown layer 10*b* epitaxially grown on the semiconductor substrate 10*a*. The bottom surface of the semiconductor base body 10 is not necessarily fixed to any potential, or may be fixed to the GND potential.

A well region 11 of n-type is deposited at the upper part of the semiconductor base body 10. The well region 11 implements the high-potential region 105. A depth of the well region 11 is set in a range of about 5 micrometers or greater and 15 micrometers or less, for example. The well region 11 has an impurity concentration of about $10^{16}$ $cm^{-3}$, for example. The well region 11 is provided with a p-channel MOSFET (not illustrated) of the high-side circuit 101.

A well region 12 of p-type is deposited at the upper part of the well region 11. A depth of the well region 12 is set in a range of about 2 micrometers or greater and 5 micrometers or less, for example. The well region 12 has an impurity concentration of about $10^{17}$ $cm^{-3}$, for example. The HVIC 100 may include a plurality of well regions 12.

The well region 12 serves as a part of the high-side circuit 101, and is provided with an n-channel MOSFET of the high-side circuit 101. A drain region (a carrier reception region) 20 of n-type of the n-channel MOSFET is provided at the upper part of the well region 12. A contact region 21 of $n^+$-type having a higher impurity concentration than the drain region 20 is provided at the upper part of the drain region 20. The contact region 21 is connected with a drain electrode 52 through the respective openings of the first insulating film 41 and the second insulating film 42.

A source region (a carrier supply region) 22 of $n^+$-type and a contact region 23 of $p^+$-type of the n-channel MOSFET are each provided at the upper part of the well region 12 separately from the n-type drain region 20. The source region 22 and the contact region 23 are in contact with each other. The contact region 23 has a higher impurity concentration than the well region 12. The source region 22 and the contact region 23 are connected with a source electrode (a VS electrode) 51 through the respective openings of the first insulating film 41 and the second insulating film 42. The VS electrode 51 is connected with the low-potential (the VS potential) side of the power source 106. The well region 12 is electrically connected to the VS electrode 51 via the contact region 23.

A gate electrode 50 of the n-channel MOSFET is provided at a position over the well region 12 between the drain region 20 and the source region 22 via a gate insulating film that is a part of the second insulating film 42.

A buried layer 13 of $n^+$-type having a higher impurity concentration than the well region 11 is deposited at the bottom of the well region 11. The buried layer 13 has a flat top surface so as to be uniformly in contact with the bottom surface of the well region 11. The impurity concentration of the buried layer 13 is set in a range of about $10^{18}$ $cm^{-3}$ or greater and $10^{20}$ $cm^{-3}$ or less, for example. The buried layer 13 has a thickness in a range of about 5 micrometers or greater and 20 micrometers or smaller, for example. The buried layer 13 can be obtained through a step of implanting n-type impurity ions such as arsenic ions into the surface of the semiconductor substrate 10*a*, a step of forming the epitaxially-grown layer 10*b* on the semiconductor substrate 10*a*, and a step of executing annealing, for example.

An extraction region 31 of p-type is provided in the well region 11 to be opposed to the well region 12 to surround the circumference of the high-side circuit 101. The cross section of FIG. 3 shows the paired extraction regions 31 interposing the well region 12, but the paired extraction regions 31 are connected to each other on the front side and on the back side of the sheet of FIG. 3. FIG. 1 schematically indicates the planar pattern of the extraction region 31 by the broken line. The extraction region 31 has a loop-shaped planar pattern.

As illustrated in FIG. 3, the extraction region 31 has a greater depth than the well region 12. The depth of the extraction region 31 is substantially the same as the depth of the well region 11. The bottom (the lower end) of the extraction region 31 is in contact with the top surface of the buried layer 13. The bottom of the extraction region 31 may be separated from the top surface of the buried layer 13 instead.

The extraction region 31 can be formed through the same process at the same time as an isolation region 30 of p-type described below. Forming the extraction region 31 simultaneously with the isolation region 30 can eliminate the additional step of forming the extraction region 31, so as to suppress an increase in process cost. The extraction region 31 has substantially the same depth as the isolation region 30. The extraction region 31 has substantially the same impurity concentration as the isolation region 30.

The impurity concentration of the extraction region 31, when formed simultaneously with the isolation region 30, is set in a range of about $10^{16}$ $cm^{-3}$ or greater and $10^{17}$ $cm^{-3}$ or less, for example, but may be changed as appropriate. The impurity concentration of the extraction region 31 is preferably as high as possible. The extraction region 31 has a width in a range of about 10 micrometers or greater and 100 micrometers or less, for example.

The extraction region 31 may be formed in a different step from the isolation region 30. The depth of the extraction region 31 in such a case may be either shallower than or greater than the depth of the isolation region 30. In addition, the impurity concentration of the extraction region 31 may be either higher than or lower than the impurity concentration of the isolation region 30.

A contact region 24 of n+-type, a contact region 25 of p+-type, and a contact region 26 of n+-type are provided at the upper part of the well region 11. The cross section of FIG. 3 shows the paired contact regions 24, the paired contact regions 25, and the paired contact regions 26 interposing the well region 12, but the respective paired contact regions 24, contact regions 25, and contact regions 26 are connected to each other on the front side and on the back side of the sheet of FIG. 3. The contact region 24, the contact region 25, and the contact region 26 each have a loop-shaped planar pattern, and are arranged along the loop-shaped planar pattern of the extraction region 31.

The contact region 25 is in contact with the upper end of the extraction region 31. The contact region 24-25 is interposed between the contact regions 24 and 26 so as to be in contact with the contact region 25. The contact region 24 is in contact with the well region 11 on the inner circumferential side of the extraction region 31. The contact region 26 is in contact with the well region 11 on the outer circumferential side of the extraction region 31. The contact region 24, the contact region 25, and the contact region 26 are connected with the VB electrode 53 through the respective openings of the first insulating film 41 and the second insulating film 42. The VB electrode 53 is connected with the high-potential (the VB potential) side of the power source 106.

The extraction region 31 is electrically connected to the VB electrode 53 via the contact region 25. The well region 11 on the inner circumferential side of the extraction region 31 is electrically connected to the VB electrode 53 via the contact region 24, and has the same potential as the extraction region 31. The well region 11 on the outer circumferential side of the extraction region 31 is electrically connected to the VB electrode 53 via the contact region 26, and has the same potential as the extraction region 31.

A voltage blocking region 14 of $n^-$-type having a lower impurity concentration than the well region 11 is arranged to surround the circumference of the well region 11 on the outer circumferential side of the extraction region 31. The cross section of FIG. 3 shows the paired voltage blocking regions 14 interposing the well region 11, but the paired voltage blocking regions 14 are connected to each other on the front side and on the back side of the sheet of FIG. 3. The voltage blocking region 14 has a loop-shaped planar pattern surrounding the outer circumference of the well region 11 to implement a part of the high-voltage isolation structure 103 illustrated in FIG. 1. The respective level shifters 104*a* and 104*b* are partly integrated with the voltage blocking region 14. The voltage blocking region 14 serves as a drain-drift region of the level shifters 104*a* and 104*b*.

The level shifter 104*a* is provided on the left side in FIG. 3. A slit region 19*a* of $p^-$-type is provided in the voltage blocking region 14 toward the well region 11 so as to isolate the junction with the well region 11. A drain region 18*a* of n-type of the level shifter 104*a* is provided at the upper part of the voltage blocking region 14. A contact region 27*a* of $n^+$-type having a higher impurity concentration than the drain region 18*a* is provided at the upper part of the drain region 18*a*. The contact region 27*a* is connected with a drain electrode 56*a* through the respective openings of the first insulating film 41 and the second insulating film 42.

A base region 15*a* of p-type of the level shifter 104*a* is provided at the upper part of the voltage blocking region 14. A source region 16*a* of n-type of the level shifter 104*a* is provided at the upper part of the base region 15*a*. A contact region 28*a* of $n^+$-type having a higher impurity concentration than the source region 16*a* is provided at the upper part of the source region 16*a*. A contact region 29*a* of $p^+$-type having a higher impurity concentration than the base region 15*a* is provided at the upper part of the base region 15*a*. The contact region 28*a* and the contact region 29*a* are connected with a source electrode 54*a* through the respective openings of the first insulating film 41 and the second insulating film 42.

A gate electrode 57*a* of the level shifter 104*a* is provided over the base region 15*a* between the voltage blocking region 14 and the source region 16*a* via agate insulating film that is a part of the second insulating film 42. The gate electrode 57*a* is connected with agate wire 55*a* through the opening of the second insulating film 42. A field plate 58*a* is provided inside the second insulating film 42 over the voltage blocking region 14 interposed between the base region 15*a* and the drain region 18*a*.

The level shifter 104*b* is provided on the right side in FIG. 3. A slit region 19*b* of p−-type is provided in the voltage blocking region 14 toward the well region 11 so as to isolate the junction with the well region 11. A drain region 18 of n-type of the level shifter 104*b* is provided at the upper part of the voltage blocking region 14. A contact region 27*b* of n+-type having a higher impurity concentration than the drain region 18 is provided at the upper part of the drain region 18. The contact region 27*b* is connected with a drain electrode 56*b* through the respective openings of the first insulating film 41 and the second insulating film 42.

A base region 15*b* of p-type of the level shifter 104*b* is provided at the upper part of the voltage blocking region 14. A source region 16*b* of n-type of the level shifter 104*b* is provided at the upper part of the base region 15*b*. A contact region 28*b* of $n^+$-type having a higher impurity concentration than the source region 16*b* is provided at the upper part of the source region 16*b*. A contact region 29*b* of $p^+$-type having a higher impurity concentration than the base region 15*b* is provided at the upper part of the base region 15*b*. The contact region 28*b* and the contact region 29*b* are connected with a source electrode 54*b* through the respective openings of the first insulating film 41 and the second insulating film 42.

A gate electrode 57*b* of the level shifter 104*b* is provided over the base region 15*b* between the voltage blocking region 14 and the source region 16*b* via a gate insulating film that is a part of the second insulating film 42. The gate electrode 57*b* is connected with a gate wire 55*b* through the opening of the second insulating film 42. A field plate 58*b* is provided inside the second insulating film 42 over the voltage blocking region 14 interposed between the base region 15*b* and the drain region 18.

The p-type isolation region 30 described above is provided to be in contact with the voltage blocking region 14 and the respective base regions 15*a* and 15*b* on the outer circumferential side of the voltage blocking region 14. The cross section of FIG. 3 shows the paired isolation regions 30 on the outside of the voltage blocking region 14, but the paired isolation regions 30 are connected to each other on the front side and on the back side of the sheet of FIG. 3. The isolation region 30 has a loop-shaped planar pattern surrounding the outer circumference of the voltage blocking region 14. The depth of the isolation region 30 is greater than the depth of the voltage blocking region 14. Each set of the base region 15*a* and the base region 15*b*, the contact region 29*a* and the contact region 29*b*, and the source electrode 54*a* and the source electrode 54*b* may also be connected to each other on the front side and on the back side of the sheet of FIG. 3. The base region (15*a*, 15*b*), the contact region (29*a*, 29*b*), and the source electrode (54*a*, 54*b*) may each have a loop-shaped planar pattern. The p-n junction between the n-type voltage blocking region 14 and the p-type isolation region 30 forms a high-voltage diode. The high-voltage diode implements the high-voltage isolation structure 103 illustrated in FIG. 1.

FIG. 3 schematically indicates parasitic pnp transistors 70 to 74 and parasitic npn transistors 75 and 76 by the circuit symbols. The parasitic pnp transistor 70 uses the p-type well region 12 as an emitter, the n-type well region 11 and the $n^+$-type buried layer 13 each as a base, and the p-type semiconductor base body 10 as a collector. The respective parasitic pnp transistors 71 and 72 use the p-type well region 12 as an emitter, the n-type well region 11 on the inner circumferential side of the extraction region 31 as a base, and the p-type extraction region 31 as a collector. The respective parasitic pnp transistors 73 and 74 use the p-type extraction region 31 as an emitter, the n-type well region 11 on the outer circumferential side of the extraction region 31 as a base, and the p-type semiconductor base body 10 as a collector.

The parasitic npn transistor 75 formed in the level shifter 104*a* on the left side in FIG. 3 uses the n-type source region 16*a* as an emitter, the p-type base region 15*a* as a base, and the $n^-$-type voltage blocking region 14 as a collector. The parasitic npn transistor 76 formed in the level shifter 104*b* on the right side in FIG. 3 uses the n-type source region 16*b* as an emitter, the p-type base region 15*b* as a base, and the $n^-$-type voltage blocking region 14 as a collector. The parasitic pnp transistors 70, 73, and 74 and the parasitic npn transistors 75 and 76 form a parasitic thyristor.

A semiconductor device of a comparative example is described below. The semiconductor device of the comparative example differs from the semiconductor device according to the first embodiment illustrated in FIG. 3 in including neither the p-type extraction region 31 in the n-type well region 11 nor the $n^+$-type contact region 24 in contact with the upper end of the extraction region 31, as illustrated in FIG. 4.

Figure 4:
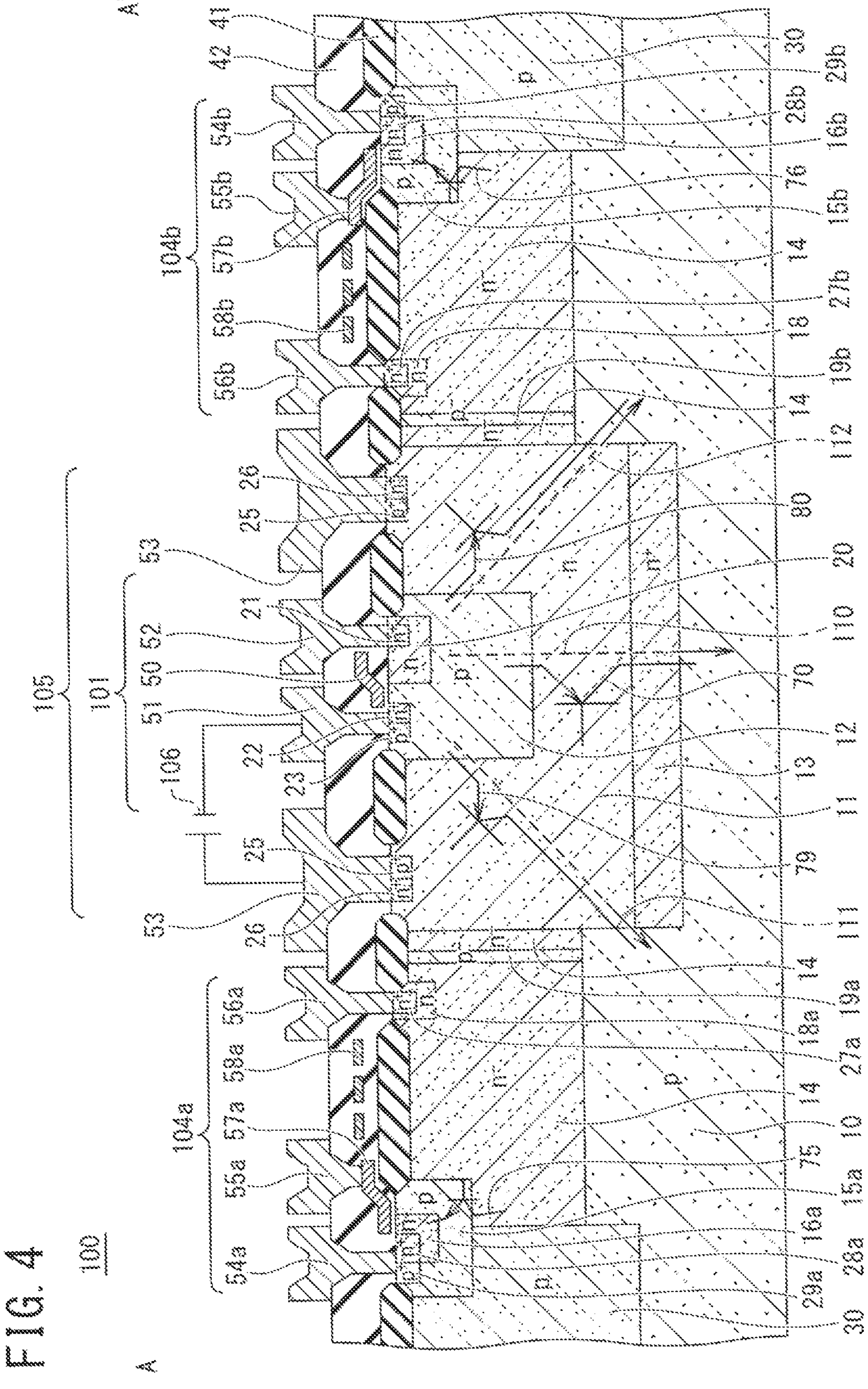
FIG. 4 is a cross-sectional view illustrating a semiconductor device of a comparative example.

FIG. 4 schematically indicates the parasitic pnp transistors 70, 79, and 80 and the parasitic npn transistors 75 and 76 by the circuit symbols. The parasitic pnp transistor 70 and the respective parasitic npn transistors 75 and 76 are the same as those in the semiconductor device according to the first embodiment illustrated in FIG. 3. The respective parasitic pnp transistors 79 and 80 use the p-type well region 12 as an emitter, the n-type well region 11 as a base, and the p-type semiconductor base body 10 as a collector. The parasitic pnp transistors 70, 79, and 80 and the parasitic npn transistors 75 and 76 form a parasitic thyristor.

During a normal operation of the HVIC 100, the VB potential higher by about 15 volts than the VS potential of the VS electrode 51 connected to the low-potential (the VS potential) side is applied to the VB electrode 53 connected to the high-potential (the VB potential) side of the power source 106. The respective parasitic pnp transistors 70, 79, and 80 at this point is in a reverse bias state between the base and the emitter, and no current flows through the respective parasitic pnp transistors 70, 79, and 80. The respective parasitic pnp transistors 70, 79, and 80 are, however, led to be a forward bias state between the base and the emitter when the VB potential of the VB electrode 53 falls below the VS potential of the VS electrode 51 by 0.6 volts or greater if external noise derived from lightning is caused, for example, and the respective parasitic pnp transistors 70, 79, and 80 are thus turned on. FIG. 4 schematically indicates, by the broken lines, current paths I10, I11, and I12 of currents that flow through the parasitic pnp transistors 70, 79, and 80 when the external noise is caused.

The collector currents I10, I11, and I12 of the parasitic pnp transistors 70, 79, and 80 flow from the VS electrode 51 to the p-type semiconductor base body 10 so as to partly increase the potential of the semiconductor base body 10. When the potential of the respective base regions 15*a* and 15*b* as the base of the respective parasitic npn transistors 75 and 76 exceeds 0.6 volts because of the increase of the potential of the semiconductor base body 10, the respective parasitic npn transistors 75 and 76 are turned on so as to start the operation of the parasitic thyristor. This state causes the current of one ampere or greater to flow through the region between the VS electrode 51 and the semiconductor base body 10, which have a difference of potential of several hundreds of volts, and therefore heat up so much and lead to damage.

To avoid damage caused by the mechanism described above, the comparative example includes the $n^+$-type buried layer 13 having a high impurity concentration deposited at the bottom of the n-type well region 11. This configuration decreases a current amplification factor hFE in the parasitic pnp transistor 70 immediately under the p-type well region 12. The current amplification factor hFE is, however, not decreased in the respective parasitic pnp transistors 79 and 80 formed in a diagonal direction from the p-type well region 12 toward a region around the end part of the buried layer 13, since the buried layer 13 is not present in the base layer. The operation of the parasitic thyristor by the parasitic pnp transistors 79 and 80 and the parasitic npn transistors 75 and 76 thus cannot be prevented, causing damage to the HVIC accordingly.

As compared with the comparative example, the semiconductor device according to the first embodiment includes the p-type extraction region 31 in the n-type well region 11, as illustrated in FIG. 3. This configuration divides the parasitic pnp transistors 79 and 80 in the semiconductor device of the comparative example illustrated in FIG. 4 so as to form the respective parasitic pnp transistors 71 to 74.

Figure 5:
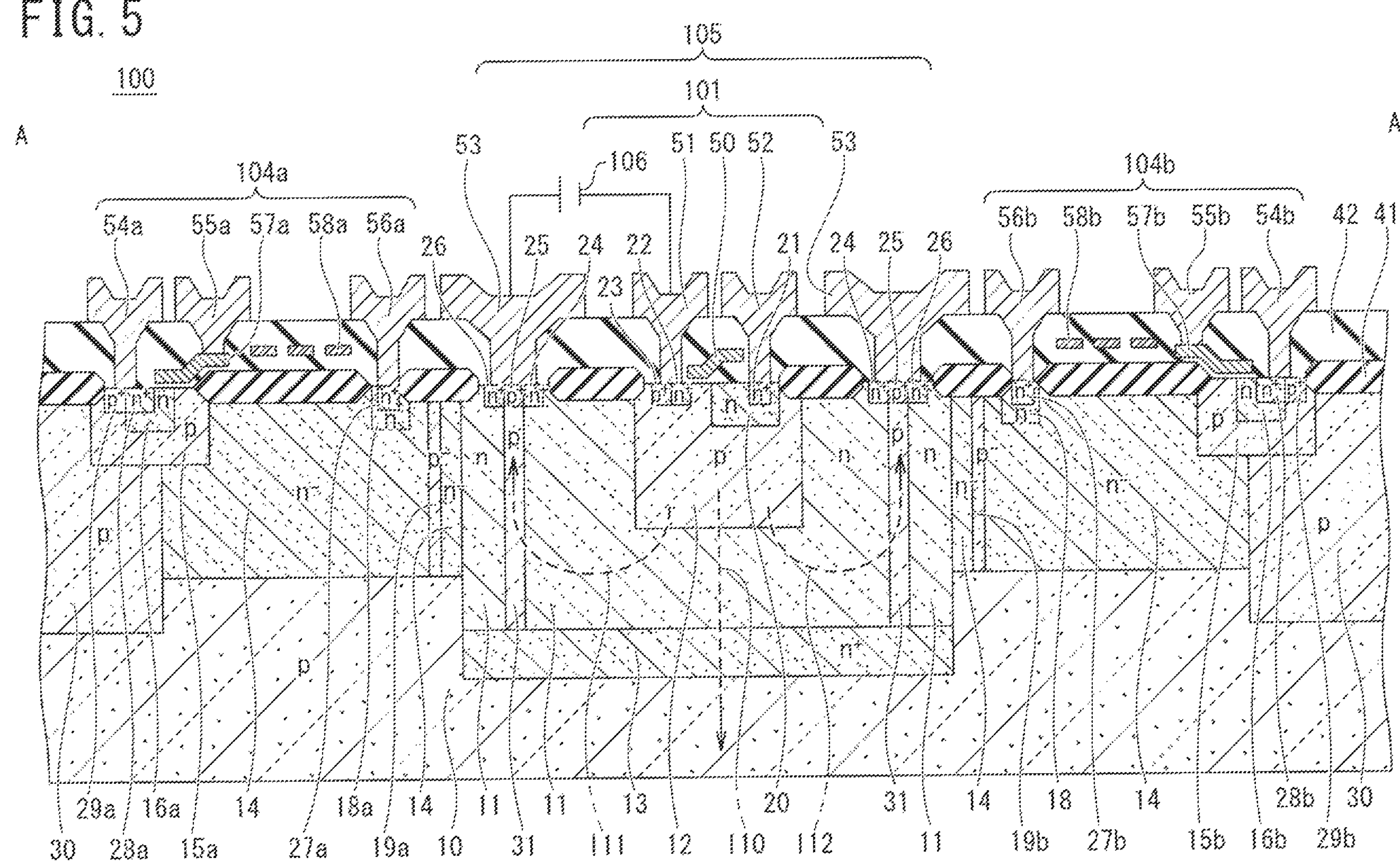
FIG. 5 is another cross-sectional view illustrating the semiconductor device according to the first embodiment.

FIG. 5 schematically indicates, by the arrows of the broken lines, the current paths 110, 111, and 112 flowing through the parasitic pnp transistors 70, 71, and 72 (refer to FIG. 3) when external noise is caused in the semiconductor device according to the first embodiment. The currents I11, and I12 between the emitter and the collector of the parasitic pnp transistors 71 and 72 are extracted to the extraction region 31 to be led to flow to the VB electrode 53 through the extraction region 31. When the potential increase in the extraction region 31 by the currents I11, and I12 between the emitter and the collector is 0.6 volts or smaller, the respective parasitic pnp transistors 73 and 74 keep the turn-off state regardless of the state under the external noise, and almost no current flows by the parasitic pnp transistors 73 and 74. The current flowing through the semiconductor base body 10 that would cause the operation of the parasitic thyristor in this case is thus only the current I10 between the emitter and the collector of the parasitic pnp transistor 70.

The potential increase ΔV in the extraction region 31 by the currents I11, and 112 between the emitter and the collector in the of the parasitic pnp transistors 71 and 72 described above depends on the product IR of the resistance R from the bottom of the extraction region 31 to the VB electrode 53 and the current I flowing to the VB electrode 53 through the extraction region 31. The resistance R is inversely proportional to the impurity concentration N and the width W of the extraction region 31. The resistor R is thus given by the following formula (1):

$$R=A/[N\times W] \quad (1)$$

where A is a coefficient of proportionality.

The potential increase ΔV in the extraction region 31 is thus given by the following formula (2):

$$\Delta V=AI/[N\times W] \quad (2)$$

Setting the impurity concentration N and the width W of the extraction region 31 thus can lead the potential increase ΔV of the extraction region 31 to be 0.6 volts or smaller.

Figure 6:
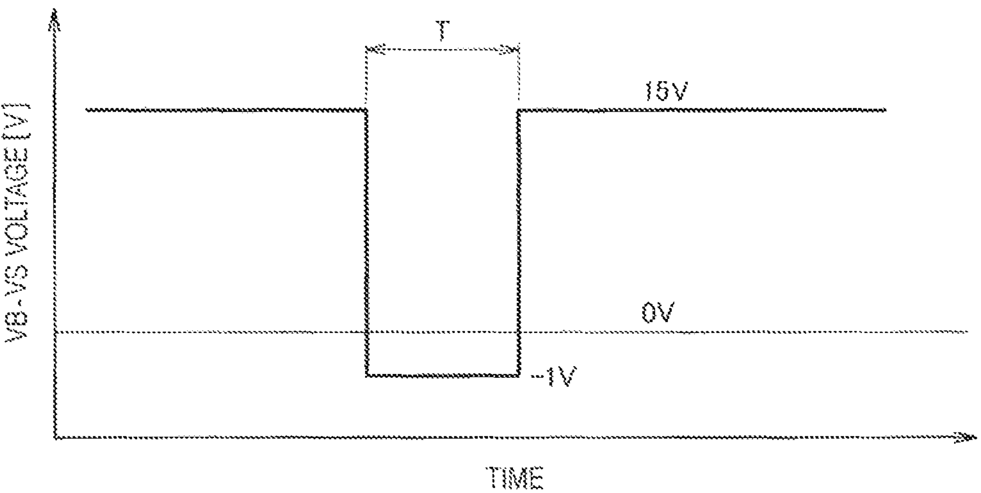
FIG. 6 is a graph showing a change in time regarding a voltage Vbs when external noise is caused.
Figure 7:
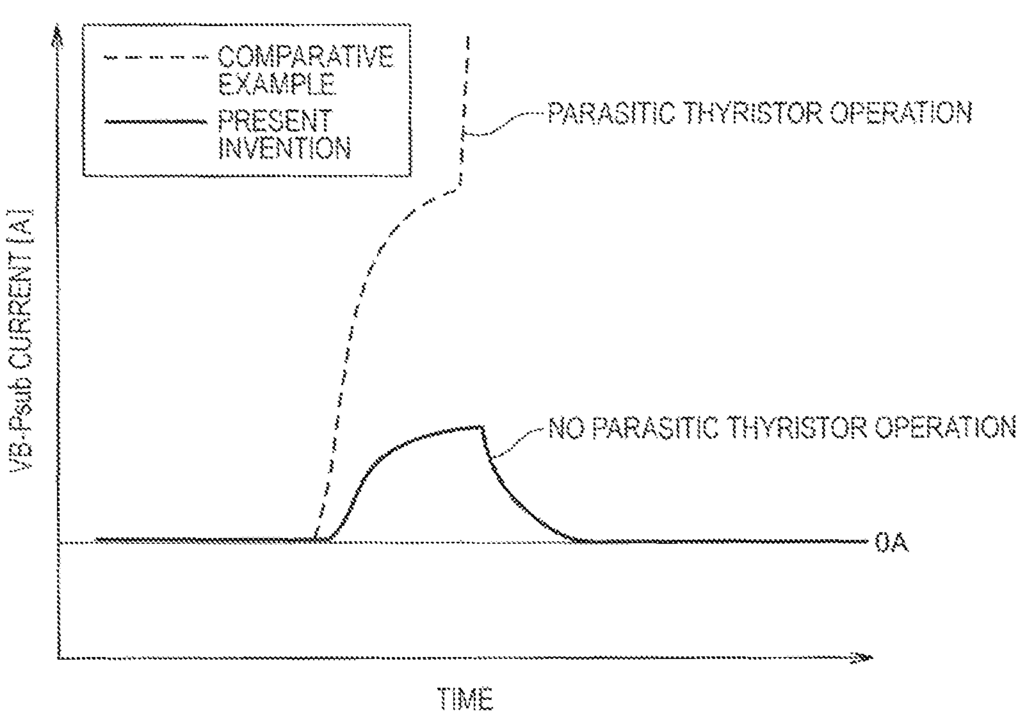
FIG. 7 is a graph showing a change in time regarding a current Isub when external noise is caused.

FIG. 6 is a graph showing a change in time regarding a voltage Vbs between the VB electrode 53 and the VS electrode 51. The voltage Vbs is 15 volts during the normal operation, but is led to be −1 volts, for example, during an external-noise applied period T. FIG. 7 is a graph showing a change in time regarding a current Isub flowing from the VS electrode 51 to the semiconductor base body 10 when the external noise is caused between the VB electrode 53 and the VS electrode 51. The indication "PRESENT INVENTION" in FIG. 7 corresponds to the semiconductor device according to the first embodiment, and the indication "COMPARATIVE EXAMPLE" corresponds to the semiconductor device of the comparative example illustrated in FIG. 4. While a large current flows due to the operation of the parasitic thyristor in "COMPARATIVE EXAMPLE", the operation of the parasitic thyristor is not caused in "PRESENT INVENTION".

As described above, the semiconductor device according to the first embodiment including the p-type extraction region 31 in the n-type well region 11 can prevent the currents I11 and I12 between the emitter and the collector of the parasitic pnp transistors 71 and 72 from flowing through the semiconductor base body 10. This configuration thus can suppress the operation of the parasitic thyristor by the parasitic pnp transistors 70 to 74 and the parasitic npn transistors 75 and 76 formed in the level shifters 104*a* and 104*b*, so as to avoid damage to the HVIC 100 accordingly.

Further, providing the extraction region 31 deeply so as to be in contact with the buried layer 13 can enhance the effect of preventing the currents I11, and I12 between the emitter and the collector of the parasitic pnp transistors 71 and 72 from flowing through the semiconductor base body 10.

Second Embodiment

Figure 8:
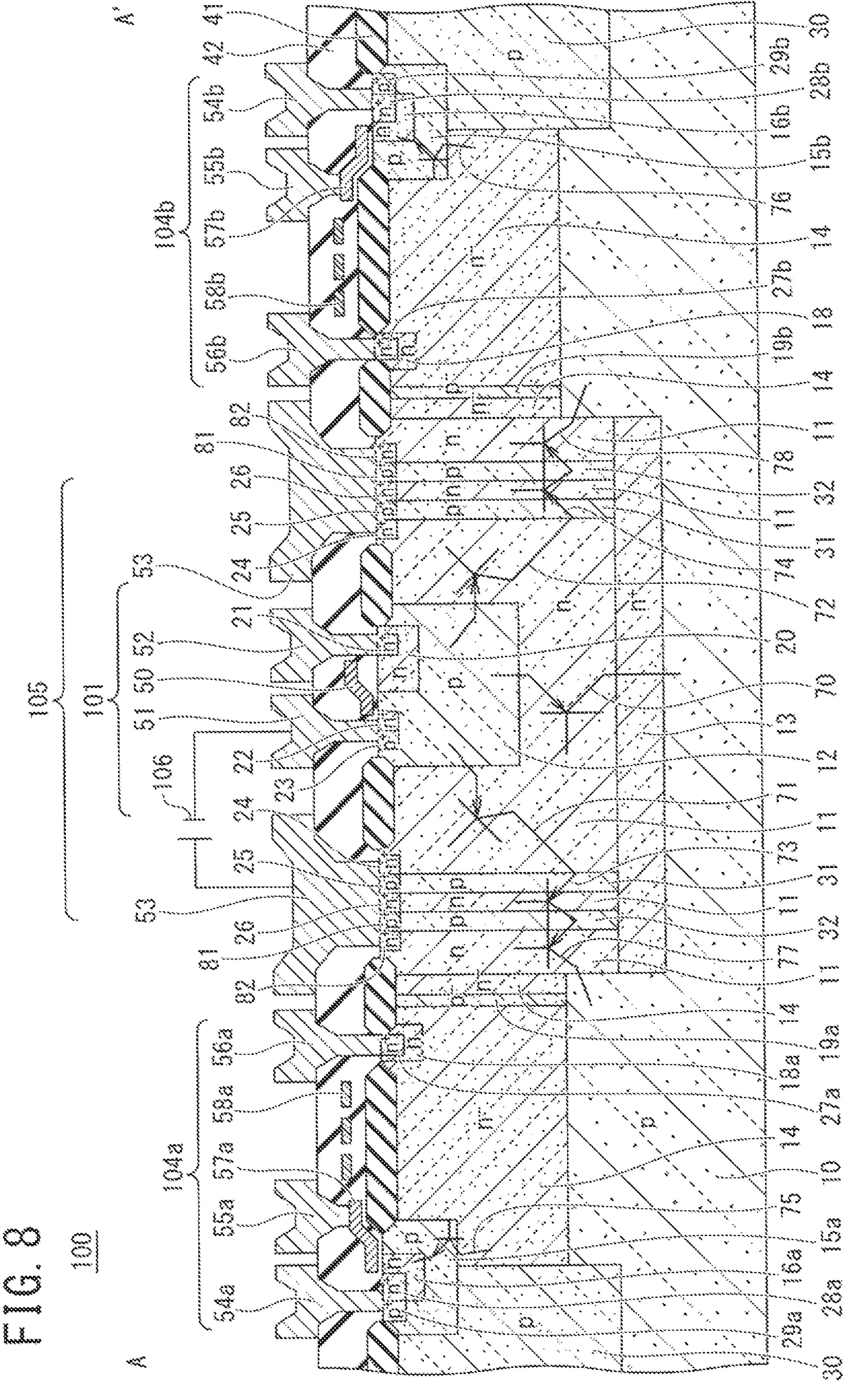
FIG. 8 is a cross-sectional view illustrating a semiconductor device according to a second embodiment.

A semiconductor device according to a second embodiment differs from the semiconductor device according to the first embodiment illustrated in FIG. 3 in including a plurality of p-type extraction regions 31 and 32 in the n-type well region 11, as illustrated in FIG. 8. The extraction regions 31 and 32 are arranged separately from each other in a direction from the high-side circuit 101 toward the voltage blocking region 14 so as to interpose the well region 11. The cross section of FIG. 8 shows the respective paired extraction regions 31 and 32 interposing the well region 12, but the respective paired extraction regions 31 and 32 are connected to each other on the front side and on the back side of the sheet of FIG. 8. The respective extraction regions 31 and 32 each have a loop-shaped planar pattern surrounding the circumference of the p-type well region 12 so as to be provided concentrically with each other about the middle of the p-type well region 12.

The extraction regions 31 and 32 each have a width set in a range of about 10 micrometers or greater and 50 micrometers or smaller, for example. The respective widths of the extraction regions 31 and 32 may be either the same or different from each other. The width of the well region 11 held by the extraction region 31 is set in a range of about 10 micrometers or greater and 50 micrometers or smaller, for example. While FIG. 8 illustrates the case in which the n-type well region 11 is interposed by the doubled layers of the p-type extraction regions 31 and 32, the n-type well region 11 may be interposed by triple or more layers of the p-type extraction regions.

The well region 11 on the inner circumferential side of the extraction region 31 is in contact with the $n^+$-type contact region 24. The upper end of the extraction region 31 is in contact with the $p^+$-type contact region 25. The well region 11 interposed between the respective extraction regions 31 and 32 is in contact with the $n^+$-type contact region 26. The upper end of the extraction region 32 is in contact with the $p^+$-type contact region 81. The well region 11 on the outer circumferential side of the extraction region 32 is in contact with the $n^+$-type contact region 82. The respective contact regions 24 to 26, 81, and 82 are connected with the VB electrode 53.

FIG. 8 schematically indicates the parasitic pnp transistors 70 to 74, 77, and 78 and the parasitic npn transistors 75 and 76 by the circuit symbols. The parasitic pnp transistors 70 to 72 and the parasitic npn transistors 75 and 76 are common to the parasitic pnp transistors 70 to 72 and the parasitic npn transistors 75 and 76 according to the first embodiment.

The parasitic pnp transistors 73 and 74 use the p-type extraction region 31 as an emitter, the n-type well region 11 interposed between the respective extraction regions 31 and 32 as a base, and the p-type extraction region 32 as a collector. The parasitic pnp transistors 77 and 78 use the p-type extraction region 32 as an emitter, the n-type well region 11 on the outer circumferential side of the extraction region 32 as a base, and the p-type semiconductor base body 10 as a collector. The respective parasitic pnp transistors 73 and 77 on the left side in FIG. 8 are connected in series so that the collector of the parasitic pnp transistor 73 is connected to the emitter of the parasitic pnp transistor 77. The respective parasitic pnp transistors 74 and 78 on the right side in FIG. 8 are connected in series so that the collector of the parasitic pnp transistor 74 is connected to the emitter of the parasitic pnp transistor 78. The other configurations of the semiconductor device according to the second embodiment are the same as those of the semiconductor device according to the first embodiment, and overlapping explanations are not repeated below.

The semiconductor device according to the second embodiment, which has the configuration in which the respective parasitic pnp transistors 73 and 77 and the respective parasitic pnp transistors 74 and 78 are connected in series, can increase the impedance of the parasitic pnp transistors 73 and 77 and the parasitic pnp transistors 74 and 78. This configuration can further prevent the current between the emitter and the collector of the parasitic pnp transistors 71 and 72 from flowing from the VS electrode 51 to the semiconductor base body 10, so as to suppress the operation of the parasitic thyristor more effectively than the semiconductor device according to the first embodiment.

Third Embodiment

Figure 9:
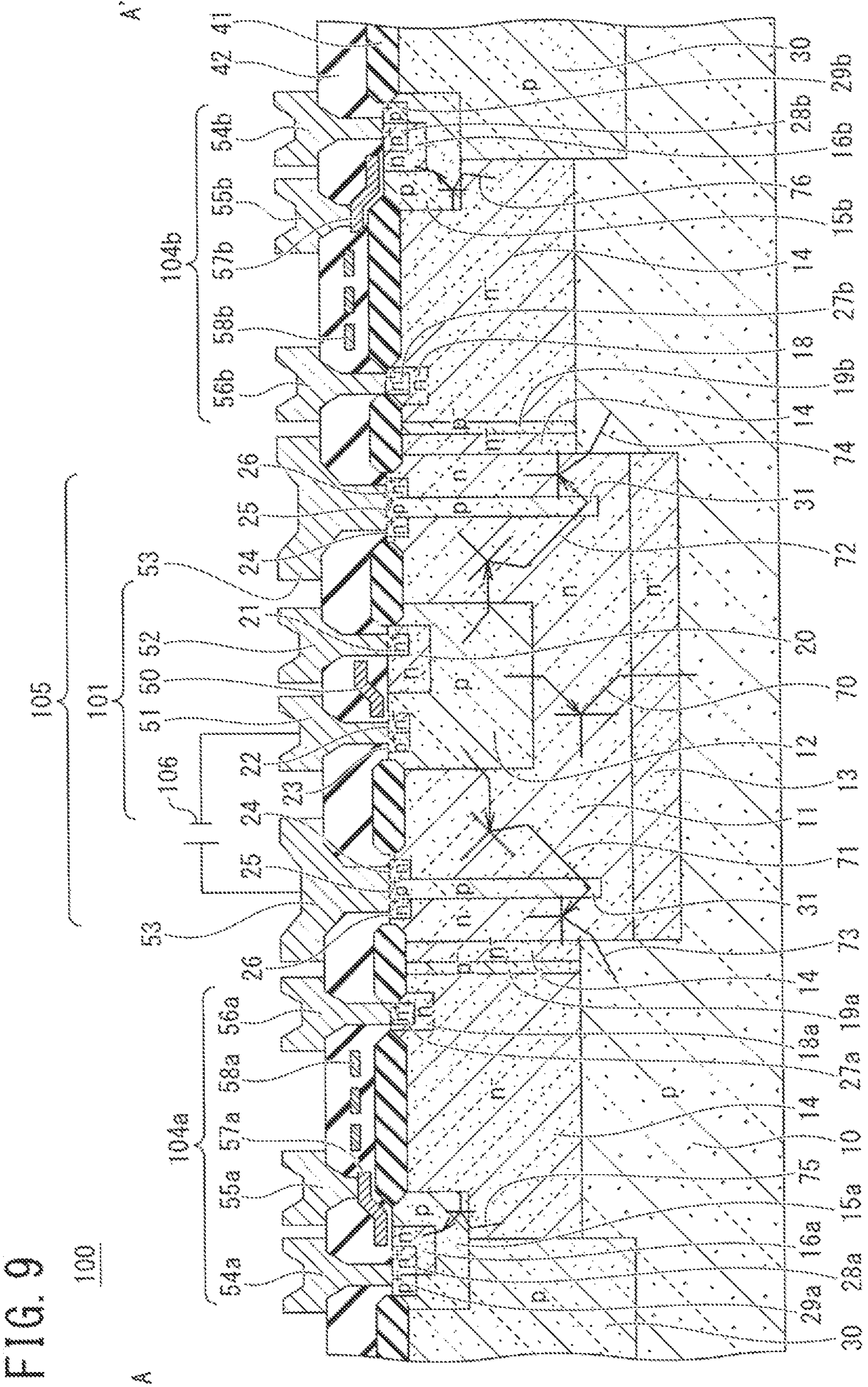
FIG. 9 is a cross-sectional view illustrating a semiconductor device according to a third embodiment.

A semiconductor device according to a third embodiment differs from the semiconductor device according to the first embodiment illustrated in FIG. 3 in that the p-type extraction region 31 deposited to have a shallower depth so that the bottom (the lower end) of the extraction region 31 is separated from the $n^+$-type buried layer 13, as illustrated in FIG. 9. The depth of the extraction region 31 is greater than the depth of the p-type well region 12. The depth of the extraction region 31 is preferably greater than the half of the depth of the n-type well region 11.

The semiconductor device according to the third embodiment, in which the well region 11 on the inner circumferential side of the extraction region 31 is joined to the well region 11 on the outer circumferential side of the extraction region 31, does not need to include either the $n^+$-type contact region 24 or the $n^+$-type contact region 26. The other configurations of the semiconductor device according to the third embodiment are the same as those of the semiconductor device according to the first embodiment, and overlapping explanations are not repeated below.

The semiconductor device according to the third embodiment has the configuration in which the bottom (the lower end) of the extraction region 31 can be separated from the $n^+$-type buried layer 13. The configuration in which the bottom (the lower end) of the extraction region 31 is separated from the $n^+$-type buried layer 13 can prevent the current between the emitter and the collector of the parasitic pnp transistors 71 and 72 from flowing from the VS electrode 51 to the semiconductor base body 10, so as to suppress the operation of the parasitic thyristor.

Fourth Embodiment

Figure 10:
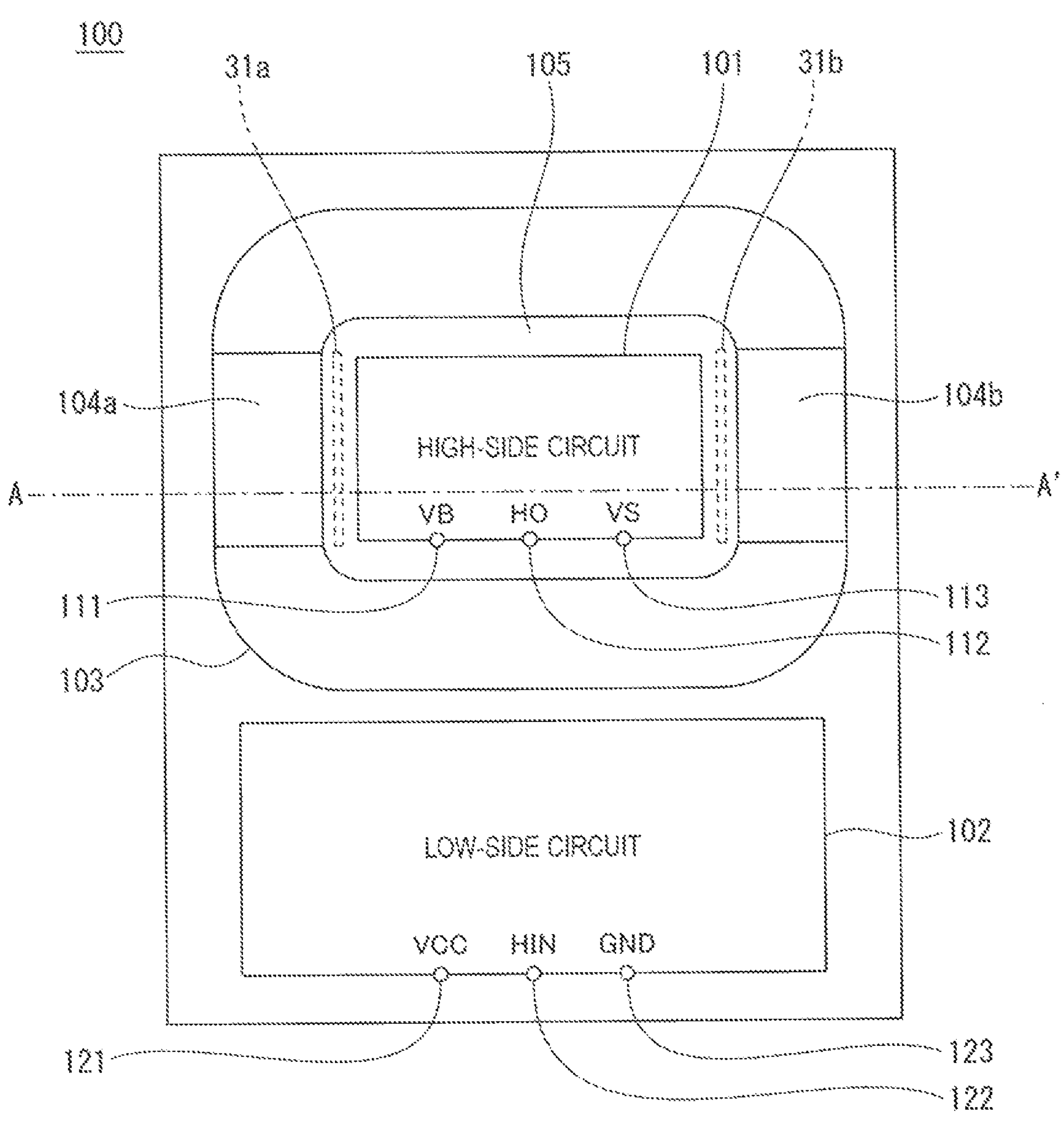
FIG. 10 is a plan view illustrating a semiconductor device according to a fourth embodiment.

FIG. 10 is a plan view illustrating a semiconductor device according to a fourth embodiment, and schematically indicates the planar pattern of the respective extraction regions 31*a* and 31*b* by the broken lines. As illustrated in FIG. 10, the semiconductor device according to the fourth embodiment differs from the semiconductor device according to the first embodiment illustrated in FIG. 1 in that the respective extraction regions 31*a* and 31*b* do not have a loop-like shape but have planar patterns separated from each other. The respective extraction regions 31*a* and 31*b* are arranged selectively at the positions opposed to the respective level shifters 104*a* and 104*b*.

The cross-sectional view taken along line A-A in FIG. 10 is common to FIG. 3. The respective extraction regions 31*a* and 31*b* are provided to partly surround the circumference of the well region 12. The other configurations of the semiconductor device according to the fourth embodiment are the same as those of the semiconductor device according to the first embodiment, and overlapping explanations are not repeated below.

The semiconductor device according to the fourth embodiment has the configuration of including the extraction regions 31*a* and 31*b* that only need to be arranged to at least partly surround the circumference of the well region 12. The provision of the respective extraction regions 31*a* and 31*b* selectively provided at the positions opposed to the level shifters 104*a* and 104*b* can suppress the operation of the parasitic thyristor by the parasitic pnp transistors 73 and 74 and the parasitic npn transistors 75 and 76 formed in the level shifters 104*a* and 104*b*.

Other Embodiments

As described above, the invention has been described according to the first to fourth embodiments, but it should not be understood that the description and drawings implementing a portion of this disclosure limit the invention. Various alternative embodiments of the present invention, examples, and operational techniques will be apparent to those skilled in the art from this disclosure.

While the respective semiconductor devices according to the first to fourth embodiments have been illustrated with the configuration in which the level shifters 104*a* and 104*b* are integrated with a part of the high-voltage isolation structure 103, the level shifters may be provided independently of the high-voltage isolation structure 103 instead. This configuration is effective particularly when the bottom surface of the semiconductor base body 10 is fixed to the GND potential.

While the respective semiconductor devices according to the first to fourth embodiments have been illustrated with the case of the HVIC, the present invention may be applied to a semiconductor device, other than the HVIC, to which a high voltage of several tens of volts or greater, for example, is applied. The present invention may also be applied to a semiconductor device not including the level shifters, which can also prevent the current between the emitter and the collector of the parasitic pnp transistor from flowing through the semiconductor base body 10, so as to avoid damage to the semiconductor device derived from the current between the emitter and the collector of the parasitic pnp transistor.

The respective configurations disclosed in the first to fourth embodiments of the present invention and the respective modified examples can be combined together as necessary within a range without contradicting each other. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

What is claimed is:

1. A semiconductor device comprising:

a semiconductor base body of a first conductivity-type;

a first well region of a second conductivity-type provided in the semiconductor base body;

at least one second well region of the first conductivity-type implementing a part of a high-side circuit provided in the first well region;

a buried layer of the second conductivity-type provided at a bottom of the first well region and having a higher impurity concentration than the first well region;

a voltage blocking region of the second conductivity-type provided at a circumference of the first well region; and an extraction region of the first conductivity-type provided in the first well region to have a greater depth than a depth of the at least one second well region at least at a part of a circumference of the high-side circuit so as to be separated from the at least one second well region between the voltage blocking region and the at least one second well region.

2. The semiconductor device of claim 1, wherein a bottom of the extraction region is in contact with the buried layer.

3. The semiconductor device of claim 1, wherein the extraction region has a loop-shaped planar pattern surrounding the circumference of the high-side circuit.

4. The semiconductor device of claim 1, wherein a level shifter is provided in a part of the voltage blocking region.

5. The semiconductor device of claim 1, wherein the extraction region is electrically connected to the first well region.

6. The semiconductor device of claim 1, wherein the first well region has a greater depth than the voltage blocking region.

7. The semiconductor device of claim 1, further comprising an isolation region of the first conductivity-type provided at a circumference of the voltage blocking region.

8. The semiconductor device of claim 7, wherein the depth of the extraction region is common to a depth of the isolation region.

9. The semiconductor device of claim 1, further comprising a base region of the first conductivity-type provided in an upper part of the voltage blocking region.

10. The semiconductor device of claim 9, further comprising:

a carrier reception region of the second conductivity-type provided in the upper part of the voltage blocking region separately from the base region; and a carrier supply region of the second conductivity-type provided in an upper part of the base region.

11. The semiconductor device of claim 1, wherein the extraction region is among a plurality of extraction regions arranged separately from each other in a direction from the high-side circuit toward the voltage blocking region.

12. The semiconductor device of claim 1, wherein a bottom of the extraction region is separated from the buried layer.

13. The semiconductor device of claim 4, wherein the extraction region is provided selectively in a part of the circumference of the high-side circuit opposed to the level shifter.

14. The semiconductor device of claim 1, further comprising:

a first electrode electrically connected to the at least one second well region; and a second electrode electrically connected to the extraction region.

15. The semiconductor device of claim 14, wherein the second electrode is electrically connected to the first well region.

16. A semiconductor device comprising:

a semiconductor base body of a first conductivity-type;

a first well region of a second conductivity-type provided in the semiconductor base body;

at least one second well region of the first conductivity-type implementing a part of a high-side circuit provided in the first well region;

a buried layer of the second conductivity-type provided at a bottom of the first well region and having a higher impurity concentration than the first well region;

a voltage blocking region of the second conductivity-type provided at a circumference of the first well region; and an extraction region of the first conductivity-type provided to have a greater depth than the at least one second well region at least at a part of a circumference of the high-side circuit in the first well region so as to be opposed to the at least one second well region, wherein the extraction region has a loop-shaped planar pattern surrounding the circumference of the high-side circuit.

17. A semiconductor device comprising:

a semiconductor base body of a first conductivity-type;

a first well region of a second conductivity-type provided in the semiconductor base body;

at least one second well region of the first conductivity-type implementing a part of a high-side circuit provided in the first well region;

a buried layer of the second conductivity-type provided at a bottom of the first well region and having a higher impurity concentration than the first well region;

a voltage blocking region of the second conductivity-type provided at a circumference of the first well region; and an extraction region of the first conductivity-type provided to have a greater depth than the at least one second well region at least at a part of a circumference of the high-side circuit in the first well region so as to be opposed to the at least one second well region, wherein a level shifter is provided in a part of the voltage blocking region.

* * * * *